United States Patent [19]

Naito

[11] Patent Number: 4,658,148
[45] Date of Patent: Apr. 14, 1987

[54] INSPECTION METHOD FOR MAGNETIC HEAD UTILIZING THE KERR EFFECT

[75] Inventor: Hiroichi Naito, Kanagawa, Japan

[73] Assignee: Fuji Photo Film Co., Ltd., Japan

[21] Appl. No.: 686,529

[22] Filed: Dec. 27, 1984

[30] Foreign Application Priority Data

Dec. 29, 1983 [JP] Japan .................................. 58-252005

[51] Int. Cl.[4] ............................................ G01N 21/21
[52] U.S. Cl. .................................... 250/571; 250/225; 250/231 R; 324/212
[58] Field of Search ................... 250/571, 231 R, 225, 250/559; 324/244, 96, 260, 210, 212; 356/364, 369

[56] References Cited

U.S. PATENT DOCUMENTS

| | | | |
|---|---|---|---|
| 3,594,582 | 7/1971 | Abeck et al. | 250/571 |
| 4,560,867 | 12/1985 | Papuchon et al. | 250/225 |
| 4,560,932 | 12/1985 | Mitsui et al. | 250/231 R |

Primary Examiner—Edward P. Westin
Attorney, Agent, or Firm—Gerald J. Ferguson, Jr.; Michael P. Hoffman; Ronni S. Malamud

[57] ABSTRACT

A light beam is made to impinge upon a light reflecting section of a magnetic head provided with a magnetic layer having the light reflecting section on the surface. A change in characteristics of the light beam reflected by the light reflecting section, which is caused by the Kerr effect in accordance with a change in internal magnetization of the magnetic layer, is detected photoelectrically. Magnetic characteristics of the magnetic head are measured on the basis of the detected change in characteristics of the reflected light beam.

5 Claims, 3 Drawing Figures

INSPECTION METHOD FOR MAGNETIC HEAD UTILIZING THE KERR EFFECT

BACKGROUND OF THE INVENTION

1. Field of the Invention

This invention relates to a method of inspecting the characteristics of a magnetic head, and particularly relates to a method of inspecting the dynamic magnetic characteristics of various minute regions of a magnetic thin film head and a magnetic resistive head.

2. Description of the Prior Art

In magnetic heads such as magnetic thin film heads exhibiting a small inductance, it is not always possible to measure the dynamic magnetic characteristics of the magnetic heads. Further, it is not possible to measure magnetic characteristics of magnetic heads in wafer form before assembly of the magnetic heads is completed. If the measurement could be conducted, it would become possible to eliminate defective parts at the wafer stage, and to use only non-defective parts for the assembly of the magnetic heads, thereby markedly improving the yield in the production of the magnetic heads.

Further, though it is possible to measure the characteristics of the completed magnetic head, it has heretofore been impossible to measure the characteristics of various minute regions of one magnetic head independently. Therefore, the characteristics of each region of one magnetic head are theoretically assumed by use of a computer. If the characteristics of each region of one magnetic head could be directly measured, it would be very advantageous in practice.

SUMMARY OF THE INVENTION

The primary object of the present invention is to provide an inspection method for a magnetic head, which realizes measurement of dynamic characteristics of various minute regions of one magnetic head.

Another object of the present invention is to provide an inspection method for a magnetic head, which realizes measurement of dynamic characteristics of a magnetic thin film head or the like in the wafer state.

The specific object of the present invention is to provide an inspection method for a magnetic head, which improves the yield in the production of magnetic heads.

The present invention provides an inspection method for a magnetic head, which comprises the steps of:

(i) making a light beam impinge upon a light reflecting section of a magnetic head provided with a magnetic material layer having the light reflecting section on the surface, (ii) photoelectrically detecting a change in characteristics of said light beam reflected by said light reflecting section, which is caused by the Kerr effect in accordance with a change in the internal magnetization of said magnetic material layer, and (iii) measuring the magnetic characteristics of said magnetic head on the basis of the detection output.

Specifically, an alternating current is applied to a coil of, for example, a magnetic thin film head, thereby causing the internal magnetization condition of the magnetic material layer to flip-flop in the longitudinal direction of the magnetic pole piece. A laser beam is made to impinge upon the surface of the magnetic material layer, and the laser beam reflected by the surface is photoelectrically detected. When the transverse Kerr effect is utilized, a change in reflectance is detected. When the longitudinal Kerr effect is utilized, a rotation angle of the plane of polarization is detected by use of a polarizer and an analyzer, thereby detecting a change in the internal magnetization condition of the magnetic material layer.

When the magnetic head is scanned by the laser beam condensed to a diameter of, for example, approximately 10 microns, it is possible to independently measure the magnetic characteristics of various regions of the magnetic head. That is, it becomes possible to obtain the dynamic magnetic characteristics (hysteresis curve) of each region of the magnetic material layer, which are exhibited when an alternating current is applied. Also, when the same measurement is conducted by changing the frequency of the alternating current, it becomes possible to ascertain the frequency response of the magnetic characteristics of the magnetic pole piece.

In the inspection method of the present invention, the characteristics of various regions of the magnetic head can be inspected by making a light beam impinge upon the magnetic head even when the magnetic head is in the wafer state. Therefore, it is possible to conduct the inspection before the magnetic head is fabricated from the wafer, and to eliminate defective parts. As a result, it becomes possible to improve the yield in the production of the magnetic head.

DESCRIPTION OF THE PREFERRED EMBODIMENTS

The present invention will hereinbelow be described in further detail with reference to the accompanying drawings.

Figure 1:
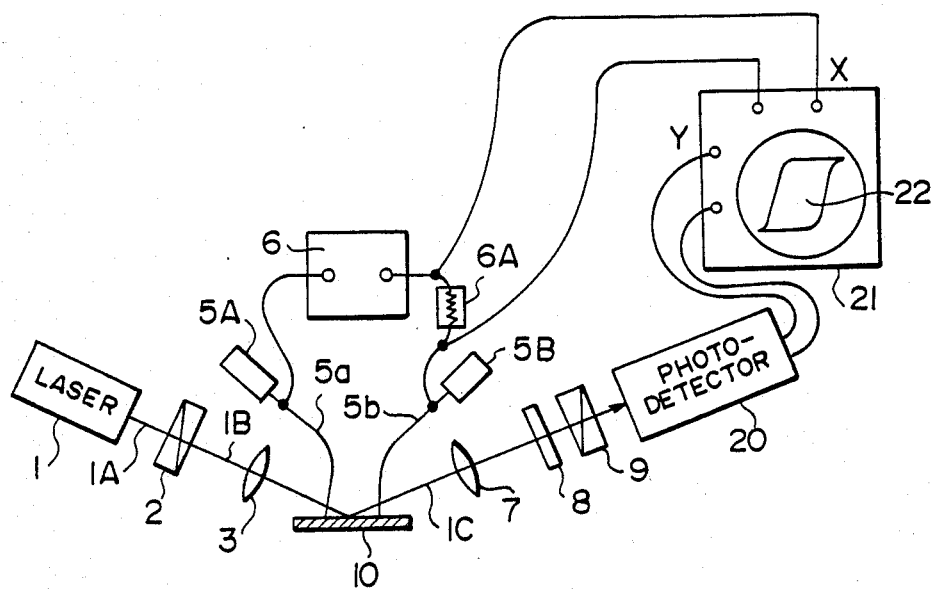
FIG. 1 is a schematic view showing an embodiment of the apparatus for carrying out the inspection method in accordance with the present invention.

FIG. 1 schematically shows an embodiment of the apparatus for inspecting the dynamic magnetic characteristics of a magnetic head and measuring the hysteresis curve by the inspection method in accordance with the present invention.

Figure 2:
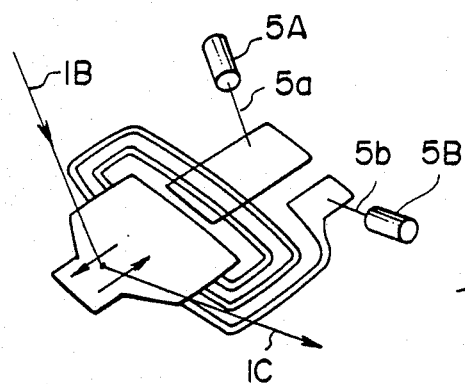
FIGS. 2 and 3 are perspective views showing the positions of the magnetic head and the light beam when the magnetic characteristics of a magnetic thin film head are inspected by utilization of the transverse Kerr effect and the longitudinal Kerr effect.
Figure 3:
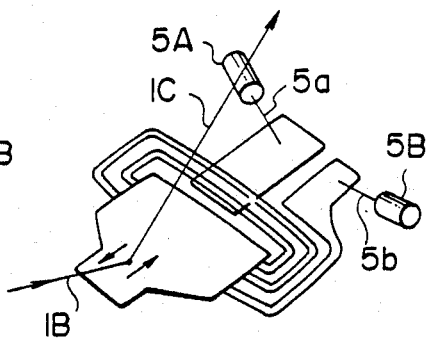

A laser beam 1A emitted by a laser beam source 1 is linearly polarized by a polarizer 2 to form a polarized laser beam 1B. The polarized laser beam 1B is condensed by a condensing lens 3 so that the beam diameter on a wafer 10 of the magnetic head is 10 microns or less and is made to impinge upon a predetermined minute region of a predetermined magnetic pole piece of the wafer 10. The wafer 10 is a wafer of, for example, a magnetic thin film head. As shown in FIGS. 2 and 3, contact needles 5a and 5b of a pair of probes 5A and 5B for the application of a drive current are electrically connected to the output ends of a coil of each magnetic head element.

The contact needles 5a and 5b of the probes 5A and 5B are connected to a high-frequency test signal generating circuit 6 and receive therefrom an alternating current signal or a square wave signal of a high frequency (e.g. 1 MHz). When the test signal is applied, a change in the positivity and negativity of the internal magnetization arises in the region of the wafer 10 which is the subject of the inspection. The change appears by the Kerr effect as the rotation of the plane of polarization of a laser beam 1C reflected by the inspected region of the wafer 10 (in the case of the longitudinal Kerr effect) or as a change in intensity of the reflected laser beam 1C (in the case of the transverse Kerr effect). The reflected laser beam 1C is received by a photodetector 20 such as a photomultiplier via a collimation lens 7, a quarter wave plate 8 and an analyzer 9. The quarter wave plate 8 eliminates elliptic polarization caused by reflection, thereby securely obtaining a linearly polarized laser beam. The analyzer 9 transmits the laser beam having an intensity which is in accordance with the angle of the plane of polarization of the polarized laser beam and makes the laser beam impinge upon the photodetector 20 (in the case where the longitudinal Kerr effect is utilized). In the case where the transverse Kerr effect is utilized, the polarizer 2, the quarter wave plate 8, and the analyzer 9 may be omitted if desired.

The output of the photodetector 20 is sent to a Y-axis input terminal of an oscilloscope 21. The output current of the high-frequency test signal generating circuit 6 is taken out as a voltage via a standard resistor 6A and is sent to an X-axis input terminal of the oscilloscope 21. In this manner, a dynamic magnetic characteristics curve (hysteresis curve) 22 of the inspected region of the wafer 10 is displayed on the oscilloscope 21.

As described above, it is possible to inspect the magnetic characteristics of an arbitrary minute region of an arbitrary magnetic pole piece of the wafer 10.

FIG. 2 shows the positions of the magnetic thin film head, the laser beam 1B and the reflected laser beam 1C when a parallel magnetization curve is measured by the utilization of the transverse Kerr effect or when an orthogonal megnetization curve is measured by the utilization of the longitudinal Kerr effect. FIG. 3 shows the positions of the magnetic thin film head, the laser beam 1B and the reflected laser beam 1C when a parallel magnetization curve is measured by the utilization of the longitudinal Kerr effect or when an orthogonal magnetization curve is measured by the utilization of the transverse Kerr effect. By "parallel magnetization curve" is meant an M-H curve of a magnetization vector component parallel to the drive magnetic field applied. By "orthogonal magnetization curve" is meant an M-H curve of a magnetization vector component normal to the drive magnetic field applied.

I claim;

1. An inspection method for a magnetic head, which comprises the steps of:
   (i) making a light beam impinge upon a light reflecting section of a magnetic head provided with a magnetic material layer having the light reflecting section on the surface,
   (ii) photoelectrically detecting a change in characteristics of said light beam reflected by said light reflecting section, which is caused by the Kerr effect in accordance with a change in internal magnetization of said magnetic material layer, and
   (iii) measuring the magnetic characteristics of said magnetic head on the basis of the detection output.

2. A method as defined in claim 1 wherein a laser beam is used as said light beam, and the internal magnetization of each minute region of said magnetic head is measured by scanning the minute region by the laser beam.

3. A method as defined in claim 1 or 2 wherein said magnetic head is a magnetic thin film head, and said internal magnetization is the internal magnetization generated when a current is applied to a coil of said magnetic thin film head.

4. A method as defined in claim 1 or 2 wherein said change in characteristics of said reflected light beam is a change in intensity of said reflected light beam.

5. A method as defined in claim 1 or 2 wherein said change in characteristics of said reflected light beam is a rotation of the plane of polarization of said reflected light beam.

* * * * *